(12) United States Patent
Neyret et al.

(10) Patent No.: US 7,863,158 B2
(45) Date of Patent: Jan. 4, 2011

(54) TREATMENT FOR BONDING INTERFACE STABILIZATION

(75) Inventors: Eric Neyret, Sassenage (FR); Sebastien Kerdiles, Saint Ismier (FR)

(73) Assignee: S.O.I.TEC Silicon on Insulator Technologies, Bernin (FR)

( * ) Notice: Subject to any disclaimer, the term of this patent is extended or adjusted under 35 U.S.C. 154(b) by 403 days.

(21) Appl. No.: 11/807,686

(22) Filed: May 29, 2007

(65) Prior Publication Data
US 2008/0014718 A1    Jan. 17, 2008

Related U.S. Application Data

(63) Continuation of application No. 11/788,292, filed on Apr. 19, 2007.

(30) Foreign Application Priority Data

Jul. 13, 2006  (FR) .................................. 06 06440

(51) Int. Cl.
H01L 21/30    (2006.01)
H01L 21/46    (2006.01)
(52) U.S. Cl. ................. 438/459; 438/455; 257/E21.212
(58) Field of Classification Search .................. 438/458, 438/459, 455; 257/E21.088, E21.212
See application file for complete search history.

(56) References Cited

U.S. PATENT DOCUMENTS

| 3,332,137 A | 7/1967 | Kenney |
| 3,355,636 A | 11/1967 | Becke et al. |
| 3,997,381 A | 12/1976 | Wanlass |
| 4,540,452 A | 9/1985 | Croset et al. |
| 4,601,779 A | 7/1986 | Abernathey et al. |
| 4,649,627 A | 3/1987 | Abernathey et al. |
| 4,704,785 A | 11/1987 | Curran |
| 4,771,016 A | 9/1988 | Bajor et al. |
| 4,794,217 A | 12/1988 | Quen et al. |

(Continued)

FOREIGN PATENT DOCUMENTS

EP    1 100 127 A1    5/2001

(Continued)

OTHER PUBLICATIONS

Mar. 10, 2010 Examination Report from the Chinese Patent Office.

(Continued)

*Primary Examiner*—Chuong A Luu
*Assistant Examiner*—Nga Doan
(74) *Attorney, Agent, or Firm*—Edwards Angell Palmer & Dodge LLP; George W. Neuner, Esq.; Brian R. Pollack, Esq.

(57) ABSTRACT

A method and/or system are provided for producing a structure comprising a thin layer of semiconductor material on a substrate. The method includes creating an area of embrittlement in the thickness of a donor substrate, bonding the donor substrate with a support substrate and detaching the donor substrate at the level of the area of embrittlement to transfer a thin layer of the donor substrate onto the support substrate. The method also includes thermal treatment of this resulting structure to stabilize the bonding interface between the thin layer and the substrate support. The invention also relates to the structures obtained by such a process.

33 Claims, 3 Drawing Sheets

U.S. PATENT DOCUMENTS

| | | | |
|---|---|---|---|
| 6,146,979 A * | 11/2000 | Henley et al. | 438/458 |
| 6,362,076 B1 | 3/2002 | Inazuki et al. | |
| 6,403,450 B1 | 6/2002 | Maleville et al. | |
| 6,849,901 B2 * | 2/2005 | Falster | 257/347 |
| 6,962,858 B2 | 11/2005 | Neyret et al. | |
| 2004/0060900 A1 * | 4/2004 | Waldhauer et al. | 216/2 |
| 2004/0248380 A1 * | 12/2004 | Aulnette et al. | 438/459 |
| 2005/0014346 A1 | 1/2005 | Mitani et al. | |
| 2005/0042840 A1 * | 2/2005 | Aga et al. | 438/458 |
| 2006/0177993 A1 * | 8/2006 | Endo et al. | 438/458 |
| 2007/0173033 A1 * | 7/2007 | Allibert et al. | 438/455 |

FOREIGN PATENT DOCUMENTS

| | | |
|---|---|---|
| EP | 1 542 274 A1 | 6/2005 |
| JP | 9260618 | 10/1997 |
| JP | 2006013179 A | 1/2006 |
| WO | WO 03/005434 A2 | 1/2003 |
| WO | WO 03/005434 A3 | 1/2003 |

OTHER PUBLICATIONS

RCA Review, Reactor Gas Flow Patterns, Semiconductor Materials and Processes, Part 2: Preparation and Properties, Comparison of Different SOI Technologies: Assets and Liabilities, L. Jastrzebski, RCA Laboratories, Princeton, NJ, RCA Review, vol. 44, Jun. 1983, pp. 250-269.

Bonding of Silicon Wafers for Silicon-On-Insulator, W.P. Maszara, et al., Aerospace Technology Center, Allied Signal Aerospace Company, J. Appl. Phys. 64 (10), Nov. 15, 1988, pp. 4943-4950.

Bonding Silicon Wafers by Use of Electrostatic Fields Followed by Rapid Thermal Heating, Materials Letters, vol. 4, No. 11.12, Oct. 1986, pp. 461-464.

Submicron Integrated Circuits, R.K. Watts, A Wiley-Interscience Publication, TK7874.I5469 1989, pp. 434-469.

A Newly Developed Silicon to Silicon Direct Adhesion Method, Shimbo et al., Toshiba Res. & Dev. Center, Toshiba Corp., pp. 337-338, 1990.

Second International Symposium on Semi-Conductor Wafer & Bonding: Science, Technology and applications, R.D. Horning an R.R. Martin, Honeywell, Inc., PV 93-29, pp. 199, 1993.

INPI, Notification D'un Rapport de Recherche Preliminaire Avec Reponse Obligatoire, Paris, 28 Fevrier 2007.

* cited by examiner

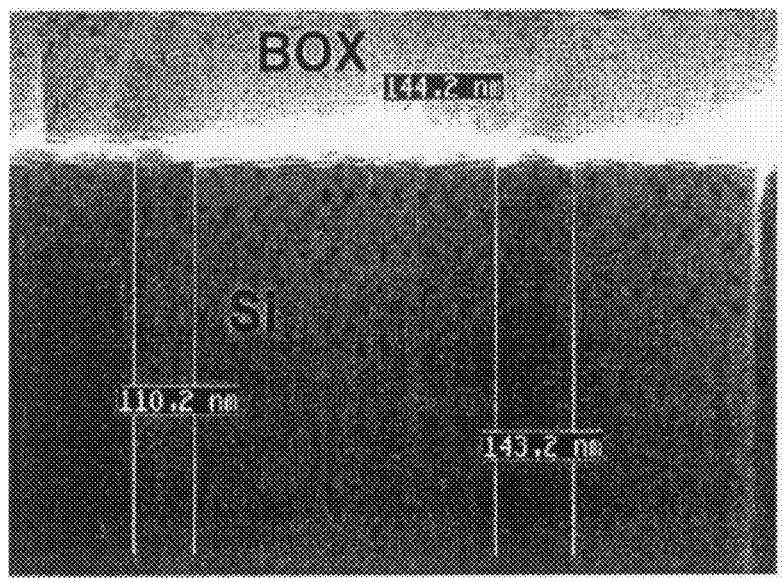
FIG_1a
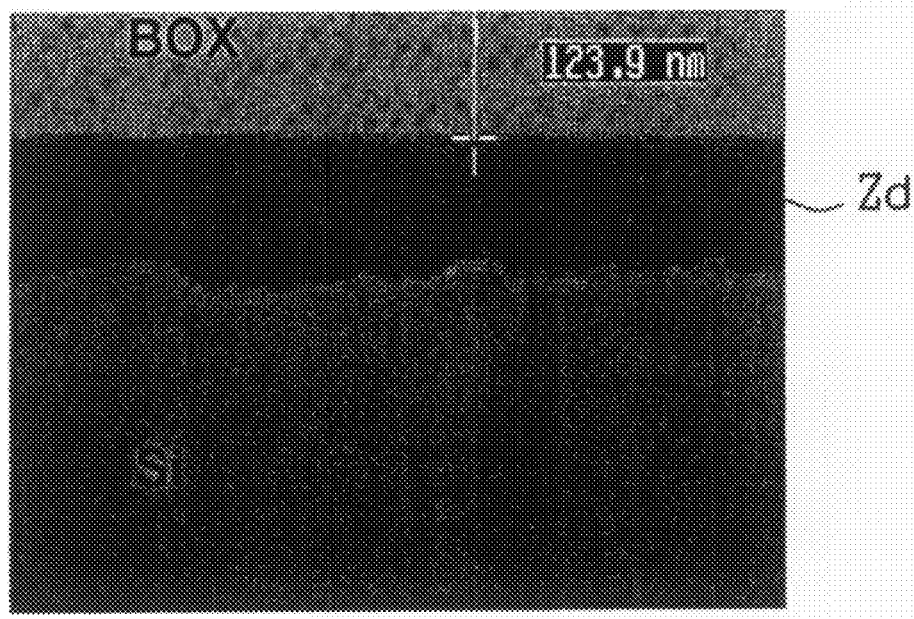
FIG_1b

TREATMENT FOR BONDING INTERFACE STABILIZATION

CROSS-REFERENCE TO RELATED APPLICATION

This application claims the benefit of priority from U.S. patent application Ser. No. 11/788,292, filed Apr. 19, 2007 and from French Patent Application Serial No. FR0606440 filed Jul. 13, 2006. The disclosure of each of these applications is incorporated by reference herein in its entirety.

BACKGROUND OF THE INVENTION

1. Field of the Invention

The present invention relates to a method and system for processing silicon materials. Particularly, the present invention is directed to a method and system for providing a thin layer of semiconductor material on a substrate and the resulting structure.

2. Description of Related Art

A variety of methods and systems are known in the art for providing a thin layer of semiconductor material on a substrate. Such methods and systems include, for example, Smart Cut™ type methods. Details concerning the Smart Cut™ method can be found in the document, "Silicon-on-Insulator Technology: Materials to VLSI, 2nd Edition," by Jean-Pierre Colinge in "Kluwer Academic Publishers," (e.g. at 50-51) and U.S. Pat. No. 5,374,564. Each of these documents is incorporated by reference herein in its entirety.

Such methods allow structures comprising a thin layer of semiconductor material to be produced on a support substrate, such as SeOI (Semiconductor On Insulator) type structures, in which an insulating layer is inserted between the thin layer and the support substrate. Structures obtained by such methods are utilized for applications in the microelectronic, optical and/or optoelectronic fields. Specifically, the thin layer is generally utilized as the active layer for forming components.

Stabilization of the bonding interface between the thin layer and the support substrate permits the structure obtained after detachment to have satisfactory mechanical and electrical properties. Partial solutions to this bonding interface stabilization problem have been proposed. For example, such solutions may recommend producing "strong" bonding between the donor substrate and the support substrate, typically by heat injection between the bonding and detachment steps of a manufacturing method, or even by performing a preparation treatment of one and/or the other of the surfaces to be bonded before the bonding step, such as by cleaning to improve hydrophilicity of the surface to be bonded, or polishing to produce a flat surface.

These solutions generally permit bonding to be reinforced by increasing the bonding energy between the donor substrate/thin layer and the support substrate. Bonding reinforcement is a microscopic phenomenon and bonding energy may be measured mechanically, for example according to the Maszara blade technique. A description of this technique may be found in the article, "Silicon-On-Insulator by Wafer Bonding: A Review," by W. P. Maszara in J. Electrochem. Soc., Vol. 138; No. 1, January 1991. This article is also incorporated by reference herein in its entirety.

However, previous solutions do not allow the bonding interface to be sufficiently stabilized. Stabilization is a microscopic phenomenon that reflects the homogeneous establishment of atomic bonds (e.g., covalent bonds) between the two substrates assembled over the entire interface. The non-establishment of these bonds, even very locally, may be revealed chemically by etching by using the Wright solution. Stated another way, a stabilized bonding interface necessarily presents high bonding energy, but the inverse need not be true.

Currently, in order to produce true stabilization of the bonding interface between the thin layer of the donor material and the support substrate, a heat treatment is generally carried out on the structure obtained after detachment and transfer of the thin layer from the donor substrate to the support substrate. This treatment generally entails furnace annealing of the structure obtained after detachment at a temperature of at least 1000° C. for several hours. This type of long-duration heat treatment will be designated as "stabilization annealing" herein.

For example, in the case of $SiO_2$/Si bonding (the layer of $SiO_2$ is typically formed on the surface of the donor substrate being intended to play the role of the insulating layer between the thin layer and the Si support substrate), stabilization annealing typically includes exposing the structure obtained after detachment for two hours at a temperature of 1100° C. U.S. Pat. No. 6,403,450 that presents an example of such stabilization annealing. This document is also incorporated by reference herein in its entirety.

However, these partial solutions including long-duration stabilization annealing to stabilize the bonding interface is not completely satisfactory.

First, the thin layer from the donor material may not support furnace stabilization annealing for several hours. For example, such annealing applied to a thin strained silicon layer is likely to generate dislocation type defects in the thickness of the thin layer and to consequently result in relaxation of the constrained material.

Second, stabilization annealing is a long operation, typically taking several hours. This requires a significant heat budget. Also, stabilization annealing complicates the manufacturing process by taking too much time, thereby increasing the production cost of such a structure.

Third, stabilization annealing is likely, because of the installations necessary for its implementation, to degrade the quality of the thin layer on support substrate. In fact, when temperature in the thin layer exceeds 1000° C., "slip line" type defects may be produced because of the appearance of constraint zones typically located at the level of the extremities of contact points between the structure and the device (known as a "boat") intended to support the structure in the furnace. Moreover, this thin layer quality degradation phenomenon is amplified when stabilization annealing is combined with other heat treatments, such as rapid thermal annealing, as is proposed in document U.S. Patent Publication No. 2005/0042840. This document is also incorporated by reference herein in its entirety. Such a combination, in fact, produces a succession of heat origin constraints that may finally combine to degrade the quality of the thin layer of the donor material.

As can be seen, a continuing need exists for an alternative technique to post-detachment stabilization annealing carried out at high temperatures for extended periods of time. The present invention provides a solution for these and other problems, as described herein.

SUMMARY OF THE INVENTION

The purpose and advantages of the present invention will be set forth in and become apparent from the description that follows. Additional advantages of the invention will be realized and attained by the methods and systems particularly pointed out in the written description and claims hereof, as well as from the appended drawings.

Generally, the invention relates to a method for producing a structure including a thin layer of semiconductor material on a substrate. The method includes creating an area of embrittlement in the thickness of a donor substrate and bonding the donor substrate to the support substrate. The method further includes detaching the donor substrate at a level proximate the area of embrittlement to form a semiconductor structure including the thin layer of the donor substrate on the support substrate. The method also includes stabilizing the bonding interface of the semiconductor structure defined between the thin layer of the donor substrate and the support substrate by performing at least one rapid thermal annealing operation.

In accordance with a further aspect of the invention, the method may further include exposing at least one of (i) an exposed face of the donor substrate and (ii) an exposed face of a support substrate to plasma to facilitate bonding of the donor substrate to the support substrate prior to the bonding step. The duration of exposure to plasma may be between about 5 seconds and about 60 seconds, preferably about 30 seconds. In accordance with one embodiment, the plasma includes at least one gaseous constituent selected from the group including Oxygen, Nitrogen, Helium, Argon, and mixtures thereof, among others. The gaseous constituent is preferably introduced into a reaction chamber containing the silicon structure at a rate of flow between about 50 sccm and about 500 sccm. In accordance with a further aspect, the gaseous constituent may be introduced into a reaction chamber to establish a mean gaseous pressure within the chamber between about 10 mTorr and about 200 mTorr, preferably about 50 mTorr. The plasma may be initiated and maintained by application of a radiofrequency power per unit of surface area of the surface to be treated in an amount between about 150 mW/cm$^2$ and about 2800 mW/cm$^2$, preferably about 750 mW/cm$^2$. For example, the plasma may be initiated and maintained by application of radiofrequency power in an amount between about 100 Watts and about 2000 Watts for a substrate in the form of a 300 mm-diameter wafer, preferably about 500 Watts.

In accordance with a preferred embodiment of the invention, the stabilized bonding interface includes no more than one defect on a selected field of about 3 μm width. In accordance with an exemplary embodiment, the field may be prepared for viewing defects by cleaving the semiconductor structure proximate the bonding interface and chemically etching the bonding interface to reveal the non-establishment of covalent bonds across the bonding interface. The bonding interface can be chemically etched, for example, using Wright solution. In one embodiment, the bonding interface is an SiO$_2$/Si interface. Preferably, the etching step is carried out for about ten seconds. In accordance with one embodiment, the stabilized bonding interface has no defect on a selected field of about 3 μm width. In accordance with another embodiment, the stabilized bonding interface has no more than one defect on three selected fields, each field having a width of about 3 μm. In accordance with still another embodiment, the stabilized bonding interface has no defect on three selected fields, each field having a width of about 3 μm.

In accordance with a further aspect of the invention, the at least one rapid thermal annealing operation can be carried out at about 1200° C. for between about 5 seconds and about 60 seconds, preferably about 30 seconds. Moreover, a second or subsequent rapid thermal annealing operation may be carried out at a temperature of about 1250° C. for between about 5 seconds and about 60 seconds.

In accordance with still another aspect, the method may further include a thinning step to further thin the thin layer of the donor substrate. The thinning step may be carried out between two rapid thermal annealing operations. In accordance with one embodiment, the thinning step may include a heat treatment operation carried out at a temperature of less than about 1000° C. In accordance with another embodiment, the thinning step includes a dry etching step. If desired, the thinning step may include annealing in an etching atmosphere including hydrochloric acid. By way of further example, the thinning step may include oxidation of the semiconductor structure at a temperature between about 800° C. and about 1000° C., preferably about 950° C. If desired, the method may also include desoxidation of the semiconductor surface to remove the layer of oxide formed during the thinning step.

In further accordance with the invention, a product is provided in accordance with the teachings herein. The product can include an electronic device, an optical device, or an optoelectronic device, among others.

It is to be understood that both the foregoing general description and the following detailed description are exemplary and are intended to provide further explanation of the invention claimed.

The accompanying drawings, which are incorporated in and constitute part of this specification, are included to illustrate and provide a further understanding of the methods and systems of the invention, and the products that may be produced therewith. Together with the description, the drawings serve to explain the principles of the invention.

BRIEF DESCRIPTION OF THE DRAWINGS

FIG. 1(a) represents a BOX (Buried Oxide) oxide/silicon Si interface that is perfectly stabilized and does not present any defect.

FIG. 1(b) represents a BOX/silicon Si interface that is insufficiently stabilized.

DETAILED DESCRIPTION OF THE PREFERRED EMBODIMENT

Figure 2A:
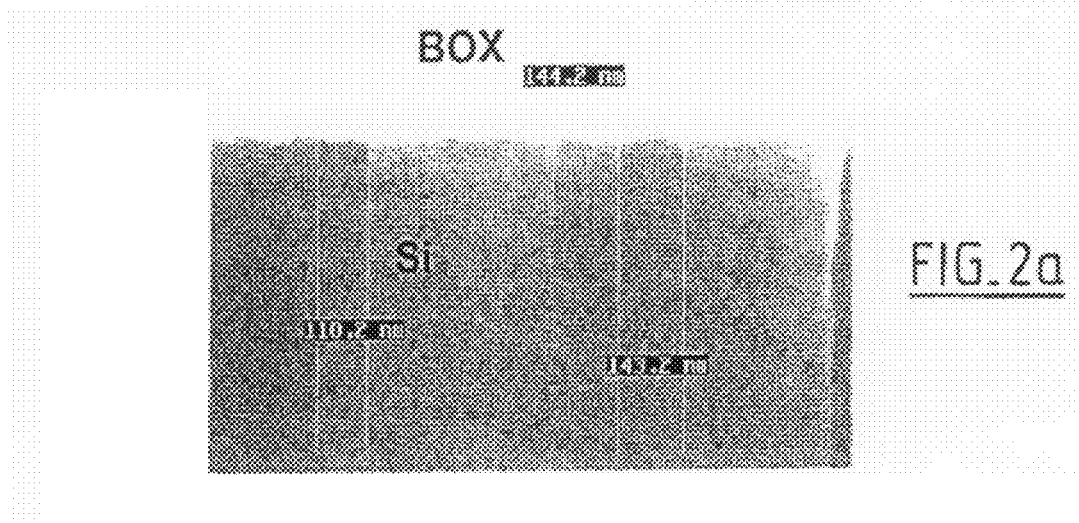
FIG. 2(a) represents an Oxide/Silicon interface highly stabilized by the implementation of conventional stabilization annealing for two hours at 1100° C.

Reference will now be made in detail to the present preferred embodiments of the invention. The method and corresponding steps of the invention will be described in conjunction with the detailed description of the system and product obtained.

The present invention relates to a method and system for processing silicon materials. Particularly, the present invention is directed to a method and system for providing a thin layer of semiconductor material on a substrate and the resulting structure.

Stabilization of the bonding interface between the thin layer and the support substrate proves to be necessary so that the structure obtained after detachment presents desirable mechanical and electrical properties. Stabilization of the bonding interface between the thin layer and the support substrate ensures strong adhesion of the thin layer and the support substrate. In the absence of such adhesion, a risk exists that the subsequent steps to form electronic components would lead to delamination of the thin layer at the level of the bonding interface. This is clearly undesirable.

In this respect it is noted that in the absence of a treatment to at least reinforce the bonding interface, immersion in an HF bath, directly after detachment, of a structure formed according to a Smart Cut™ type method, may lead to detachment of the thin layer at the periphery of the structure over a radial extent of several microns, or even to the total detachment of the thin layer. Moreover, the quality of the bonding at the level of the bonding interface is likely to modify the behavior of charge carriers in the thin layer. In order to ensure satisfactory and reproducible electric performance, it is therefore necessary that the bonding interface be stabilized.

It is possible to characterize the correct stabilization of a thin layer/support substrate bonding interface by producing cleavage of the structure and etching of the bonding interface by using a Wright type solution (for approximately 10 seconds in the case of an $SiO_2$/Si interface). If the interface is not stabilized, or is poorly stabilized, the etching reveals a significant number of defects at the level of the interface, or even results in complete etching of the interface. On the contrary, if the interface is perfectly stabilized, no defect is apparent.

More precisely, in the context of the present invention, it is considered that an interface is correctly stabilized once, by scanning electronic microscope (SEM) observation of the bonding interface after Wright etching, for example over three fields, each with a width of about 3 μm, a number of defects less than or equal to 1 are counted on each field. As such, an interface presenting no defect over each of three fields (of 3 μm in width each) will then be considered to be perfectly stabilized herein. Similarly, an interface presenting 1 defect per field over each of three fields (of 3 μm in width each) will be considered to be weakly stabilized herein. However, this weak stabilization will still prove to be satisfactory in the fields of application of the invention. Lastly, an interface presenting more than 1 defect per field over each of three fields (of 3 μm in width each) will be considered to be unstabilized herein.

FIG. 1(a) represents a BOX (Buried Oxide) oxide/silicon Si interface that is perfectly stabilized and does not present any defect. On the other hand, FIG. 1(b) represents a BOX/silicon Si interface that is insufficiently stabilized and presents a defective area Zd between the BOX oxide layer and the Si substrate. This defective zone Zd presents defects revealed by Wright etching (in numbers greater than 1 defect/field observed by SEM).

Accordingly, a first method for producing a structure comprising a thin layer of semiconductor material on a substrate is provided. The method includes creating an area of embrittlement in the thickness of the donor substrate, bonding the donor substrate with a support substrate, and detaching the donor substrate at the level of the area of embrittlement to transfer a thin layer of the donor substrate onto the support substrate. The method further includes thermal treatment of the structure obtained after detachment to stabilize the bonding interface between the thin layer and the substrate support, such as by implementing one or more rapid thermal annealing operations.

As described herein, the invention relates to the production of structures comprising a thin layer of semiconductor material on a support substrate, the thin layer being obtained by detachment at the level of a donor substrate in the thickness of which a zone of embrittlement has previously been created. The zone of embrittlement may be created in the thickness of the donor substrate at a depth near to or greater than the thickness of the thin layer to be transferred by implantation of the atomic species or by formation of a porous layer, or even by any other method that is able to locally fragilize the mechanical bonds in the donor substrate. Bonding is then achieved by, inter alia, close contact and molecular adhesion of the donor substrate with the support substrate. After bonding, the donor substrate is detached at the level of the zone of embrittlement, typically by heat injection and/or application of mechanical force, to transfer part of the donor substrate onto the support substrate and to form the thin layer on the latter.

Methods according to the invention also may include a heat treatment step for the structure obtained after detachment to stabilize the bonding interface between the thin layer and the support substrate. Preferred embodiments of the invention include stabilizing the bonding interface without resorting to stabilization annealing (e.g., furnace annealing at a temperature of at least 1000° C. for several hours). In accordance with one embodiment, this heat treatment step may include one or more rapid thermal annealing ("RTA") type operations. Applicants have noticed that in a particularly surprising manner, it is possible to stabilize the bonding interface by performing the heat stabilization treatment step over a duration that is definitely shorter than that which had been considered to be necessary until now (typically annealing at a temperature over 1000° C. for a duration over 30 minutes). A stabilized interface as embodied herein refers to an interface presenting microscopic defects following Wright etching with a density that is less than a limit density, typically 1 defect/field (of 3 μm in width) observed by a SEM microscope.

Rapid annealing steps carried out herein may be carried out in a conventional RTA furnace such as, for example, an AST 3000 or Helios furnace, commercially available from Matson, Dornstadt, Germany; or a Centura Radiance furnace, commercially available from Applied Materials, Inc. (Santa Clara, Calif.). By way of further example, rapid annealing may also be carried out in an epitaxy frame. Rapid annealing is preferably performed in controlled atmosphere. This may be an atmosphere including a mixture of hydrogen and argon, an atmosphere of pure argon, of pure hydrogen, or even an atmosphere comprising hydrochloric acid, among others. Typical gas flow rates may be, for example, more than about several standard liters per minute of total gas flow. Typical pressures may be from about 200 Torr to about atmospheric pressure.

Generally, the RTA operation is implemented in such a way as to present a heat budget (duration/temperature pair) that is greater than a minimal budget. The RTA temperature must also typically be maintained over 1000° C. for approximately several seconds to several minutes. For example, it is typically possible to ramp the temperature upwardly between about 10° C. per second and about 50° C. per second up to a soak temperature of about 1200° C. for about thirty seconds and then cool down.

The embodiment of the stabilization step described above is preferentially carried out in conjunction with a step, performed after detachment, of thinning of the thin layer. This thinning step particularly allows the thickness of the thin layer transferred onto the support substrate to be reduced to bring the thin layer to the desired thickness for the final structure. The thinning step also allows the surface of the thin layer to be thinned in advance of a smoothing step in a subsequent RTA operation. The thinning step may be implemented after the stabilization heat treatment step. However, it may also be performed beforehand, such as in the case of plasma treatment, described in further detail below.

The thinning step is preferentially implemented by performing an oxidation heat treatment of the thin layer (an oxide layer is then formed on the thin layer). Oxidation is achieved by heating the structure under gaseous oxygen, for example. In any case, thermal oxidation is achieved at a temperature of less than or equal to 1000° C.; for example, at a temperature between 800° C. and 1000° C., preferably at a temperature of 950° C. It will be appreciated by those of skill in the art that the act of performing thinning at a temperature of less than or equal to 1000° C. allows the generation of slip lines to be limited.

After the thinning step, a desoxidation operation may be performed to remove the oxide layer formed during oxidation. This may be achieved, for example, by plunging the structure for several minutes in a 10% or 20% hydrofluoric acid solution.

The thinning step may also be carried out in a variety of other ways. For example, thinning may be carried out by performing dry etching of the thin layer. By way of further example, the thinning step may be accomplished by implementing annealing in an etching atmosphere (for example, HCl) at temperatures of less than or equal to 1000° C.

In accordance with a first preferred embodiment of the method of the invention, long-duration stabilization annealing is replaced by performing at least two RTA rapid thermal annealing operations. Specifically, two RTA operations may be implemented at a higher temperature than the temperature at which stabilization annealing is conventionally carried out. Taking the example of the stabilization of a conventional $SiO_2/Si$ bonding interface by exposing the structure obtained post-detachment to a temperature of 1100° C. for two hours, two RTA operations may be carried out in accordance with the invention, wherein each RTA operation has a duration of about 30 seconds, and at a temperature of 1200° C. However, it will be noted that the invention is not limited to this heat budget (30 sec/1200° C.) for each of the RTA operations. For example, other combinations of times and temperatures may be used, such as temperatures greater than 1200° C., typically up to approximately 1250° C., and/or durations over 5 seconds, typically up to 60 seconds.

In the scope of a preferential variation of this first embodiment, the thin layer thinning step is carried out between each RTA operation. Thinning may be carried out by the implementation of thermal oxidation at a temperature of less than or equal to 1000° C. followed by desoxidation as described above.

In accordance with another embodiment of the invention, the stabilization annealing step may be replaced by performing a bonding energy reinforcement step carried out before detachment, and a stabilization step for the bonding interface carried out by implementing one or more rapid thermal annealing operations after detachment.

For purposes of illustration and not limitation, as embodied herein, the bonding energy reinforcement step may be implemented before bonding and preferably includes a plasma treatment of one and/or the other of the surfaces to be bonded. Specifically, in the scope of this second embodiment, the donor substrate (oxidized or not oxidized in such a way as to form an oxide layer used as the insulating layer inserted between the thin layer and the support substrate) and/or the donor substrate (oxidized or not oxidized for the same reasons) is (are) exposed to plasma, before close contact with the faces to be bonded.

The duration of exposure to plasma is between 5 and 60 seconds; it typically is approximately 30 seconds. Equipment conventionally utilized in microelectronics to perform dry etching may be utilized in order to implement this plasma treatment step. In particular, this is equipment allowing RIE (Reactive Ion Etching) type etching to be carried out. Suitable equipment may include, for example, a Telius chamber with DRM, commercially available from Tokyo Electron, Tokyo, Japan. By way of further example, plasma treatment may be carried out in a vacuum chamber, or even at atmospheric pressure.

A pure gas (typically $O_2$, and possibly $N_2$, He or Ar), or a gaseous mixture is introduced in the chamber, with a rate of flow on the order of 50 to 500 sccm, in such a way as to establish pressure between 10 and 200 mTorr (typically 50 mTorr) proximate the surface of the wafer. The plasma may be initiated and then maintained by the application of a radiofrequency power per unit of surface in the range of 150-2800 $mW/cm^2$, and typically on the order of 750 $mW/cm^2$ (or in the range of 100-2000 W, and typically on the order of 500 W, for a substrate in the form of a 300 mm-diameter wafer).

Plasma treatment allows the bonding interface to be more easily stabilized during later thermal treatment. Therefore, in the case where plasma treatment of one and/or the other of the surfaces to be bonded is implemented before bonding according to the conditions indicated previously, the bonding interface stabilization heat treatment step may consist of performing RTA type rapid thermal annealing at 1200° C., for a duration of between 5 and 60 seconds, typically approximately 30 seconds.

In the scope of a preferential variation of this embodiment including a plasma assisted bonding enhancement step, the thin layer thinning step is carried out after the RTA operation. Here, thinning is achieved by the implementation of thermal oxidation at a temperature of less than or equal to 1000° C. followed by desoxidation as described above.

The implementation, before detachment, of a bonding energy reinforcement step (such as by using plasma) has an impact on the ability to easily stabilize the bonding interface through a rapid thermal annealing step performed post-detachment.

By performing a bonding energy reinforcement step it becomes possible to perform RTA annealing wherein the heat budget is lower than RTA annealing in the scope of other embodiments of the invention described herein. RTA annealing of the present embodiment may therefore be faster or carried out at a lower temperature than the RTA annealing of the earlier described method that includes multiple RTA steps.

In addition, it is possible in the scope of this second embodiment to highly stabilize the bonding interface by performing a number of rapid thermal annealing operations that is less than the number of operations necessary in the scope of the first embodiment. A single RTA operation is typically only performed in the scope of this second embodiment when two RTA operations may prove to be necessary in the scope of the first embodiment to highly stabilize the bonding interface.

Figure 2B:
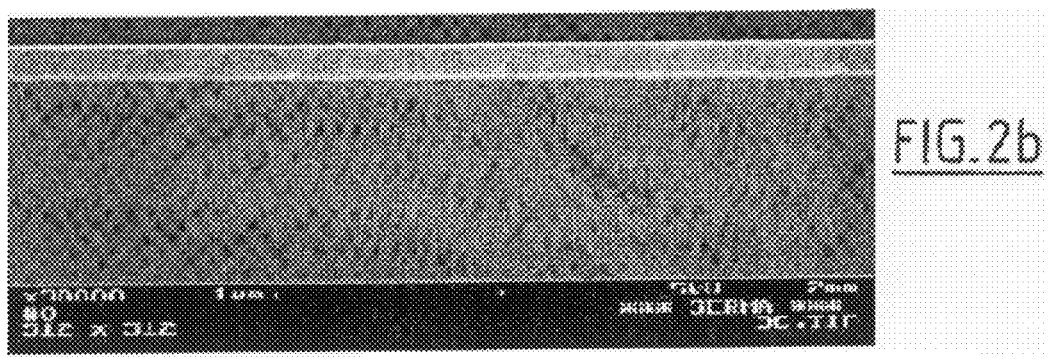
FIG. 2(b) represents an Oxide/Silicon interface stabilized by the implementation of two RTA operations at a temperature of 1200° C. for 30 seconds, between which a thinning step is carried out by thermal oxidation.
Figure 2C:
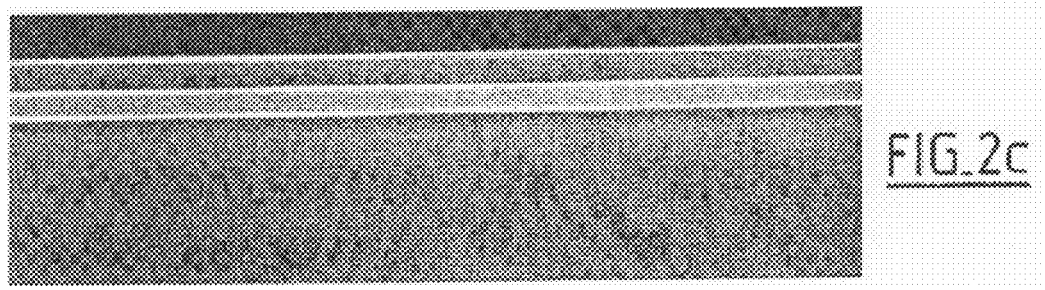
FIG. 2(c) represents an Oxide/Silicon interface highly stabilized by (i) pre-detachment reinforcement by way of plasma treatment, (ii) a post-detachment RTA sequence (1200° C./30 seconds) and (iii) thermal oxidation thinning at a temperature of less than or equal to 1000° C.
Figure 3:
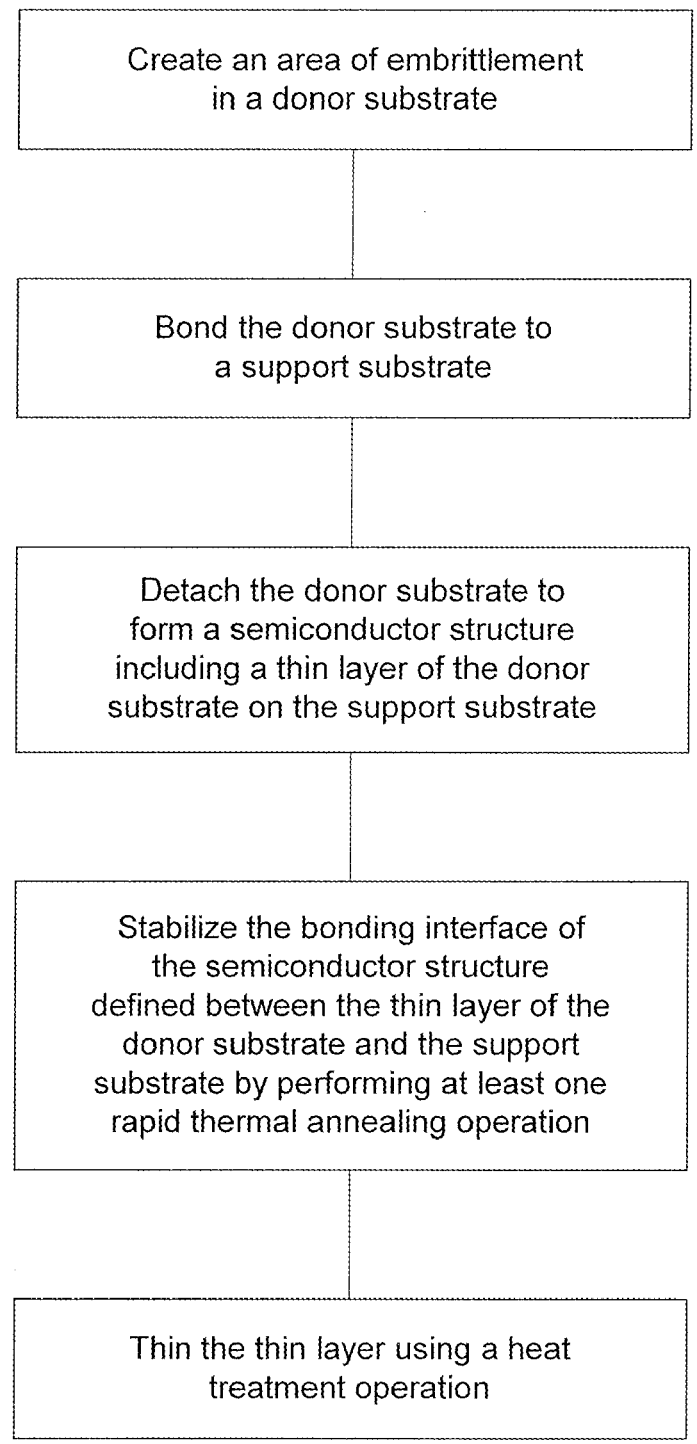
FIG. 3 is a flow chart illustrating an exemplary embodiment of the method for producing a structure including a thin layer of semiconductor material on a substrate.

FIGS. 2(a)-2(c) illustrate the stabilization of the bonding interface. FIG. 2(a) represents an Oxide/Silicon interface highly stabilized by the implementation of conventional stabilization annealing for two hours at 1100° C. (similar to FIG. 1(a)). In other words, FIG. 2(a) represents the results of a prior art technique utilizing a substantial heat budget. FIG. 2(b) represents an Oxide/Silicon interface weakly stabilized (as described herein) by the implementation, in conformance with the preferential variation of the multiple RTA embodiment described above, of two RTA operations at a temperature of 1200° C. for 30 seconds, between which is inserted a thinning step carried out by thermal oxidation at a temperature of less than or equal to 1000° C.

FIG. 2(c) represents an Oxide/Silicon interface highly stabilized by the implementation, in conformance with the preferential variation of the first embodiment, of a pre-detachment reinforcement of bonding energy in the form of plasma treatment (plasma treatment time: 30 seconds; average pressure: 50 mTorr; power: 500 Watts; gas flow rate: 200 sccm) and of a post-detachment RTA sequence (1200° C./30 seconds) in a hydrogen-argon atmosphere and thermal oxidation thinning at a temperature of less than or equal to 1000° C. Generally, thermal oxidation may be carried out, for example, by (i) heat treatment at 950° C. for a time period between about 20 minutes and about one hour, followed by (ii) wet oxidation annealing and (iii) stripping of the oxide formed using hydrofluoric acid.

It is observed in FIG. 2(b) that stabilization of the bonding interface (such as revealed by Wright etching) is not perfect: a low density of defects may effectively be detected. However, this low presence of defects is not detrimental inasmuch as the stabilization obtained proves to be satisfactory in the fields of application of the invention.

In summary, the operations carried out after detachment (such as preferential RTA/thinning/RTA) and plasma+ RTA/thinning sequence operations, may be completed by additional steps being carried out (for example, additional thinning steps, typically in the form of oxidation/desoxidation) still at a temperature of less than or equal to 1000° C.

As will be appreciated by those skilled in the art, various embodiments of the invention provide for a method that produces stabilized silicon structures without a need for a long anneal process (e.g., 1100° C. for about two hours), as has been typically thought to be needed to produce stabilized silicon structures.

The methods and systems of the present invention, as described above and shown in the drawings, provide for a semiconductor structure with satisfactory electrical and mechanical properties. It will be appreciated by those of skill in the art that the teachings herein are applicable to different semiconductor structures including different materials. Methods carried out in accordance with the invention permit production of such a product with a reduced heat budget. It will be apparent to those skilled in the art that various modifications and variations can be made in the device and method of the present invention without departing from the spirit or scope of the invention. Thus, it is intended that the present invention include modifications and variations that are within the scope of the appended claims and their equivalents.

What is claimed is:

1. A method for producing a structure including a thin layer of semiconductor material on a substrate, comprising:
   a) creating an area of embrittlement in the thickness of a donor substrate;
   b) bonding the donor substrate to a support substrate;
   c) detaching the donor substrate at a level proximate the area of embrittlement to form a semiconductor structure including a thin layer of the donor substrate on the support substrate;
   d) stabilizing the bonding interface of the semiconductor structure defined between the thin layer of the donor substrate and the support substrate by performing at least one rapid thermal annealing operation; and
   e) thinning the thin layer using a heat treatment operation carried out at a temperature of less than 1000° C.

2. The method of claim 1, further comprising exposing at least one of (i) an exposed face of the donor substrate and (ii) an exposed face of a support substrate to plasma to facilitate bonding of the donor substrate to the support substrate prior to the bonding step.

3. The method of claim 2, wherein the duration of exposure to plasma is between about 5 seconds and about 60 seconds.

4. The method of claim 3, wherein the duration of exposure to plasma is about 30 seconds.

5. The method of claim 2, wherein the plasma includes at least one gaseous constituent selected from the group consisting of Oxygen, Nitrogen, Helium, Argon, and mixtures thereof.

6. The method of claim 5, wherein the at least one gaseous constituent is introduced into a reaction chamber containing the silicon structure at a rate of flow between about 50 sccm and about 500 sccm.

7. The method of claim 6, wherein the at least one gaseous constituent is introduced into a reaction chamber to establish a mean gaseous pressure within the chamber between about 10 mTorr and about 200 mTorr.

8. The method of claim 6, wherein the at least one gaseous constituent is introduced into a reaction chamber to establish a mean gaseous pressure within the chamber of about 50 mTorr.

9. The method of claim 2, wherein the plasma is initiated and maintained by application of a radiofrequency power per unit of surface area of the surface to be treated in an amount between about 150 mW/cm$^2$ and about 2800 mW/cm$^2$.

10. The method of claim 9, wherein the plasma is initiated and maintained by application of a radiofrequency power per unit of surface area of the surface to be treated in an amount of about 750 mW/cm$^2$.

11. The method of claim 2, wherein the plasma is initiated and maintained by application of a radiofrequency power in an amount between about 100 Watts and about 2000 Watts for a substrate in the form of a 300 mm-diameter wafer.

12. The method of claim 2, wherein the plasma is initiated and maintained by application of a radiofrequency power in an amount of about 500 Watts for a substrate in the form of a 300 mm-diameter wafer.

13. The method of claim 1, wherein the stabilized bonding interface has no more than one defect on a selected field of about 3 μm width.

14. The method of claim 13, wherein the field is prepared for viewing defects by:
   a) cleaving the semiconductor structure proximate the bonding interface; and
   b) chemically etching the bonding interface to reveal the non-establishment of covalent bonds across the bonding interface.

15. The method of claim 14, wherein the bonding interface is chemically etched using Wright solution.

16. The method of claim 15, wherein the bonding interface is an SiO$_2$/Si interface.

17. The method of claim 16, wherein the etching step is carried out for about ten seconds.

18. The method of claim 1, wherein the stabilized bonding interface has no defect on a selected field of about 3 gm width.

19. The method of claim 1, wherein the stabilized bonding interface has no more than one defect on three selected fields, each field having a width of about 3 μm.

20. The method of claim 19, wherein the stabilized bonding interface has no defect on three selected fields, each field having a width of about 3 μm.

21. The method of claim 1, wherein the at least one rapid thermal annealing operation is carried out at about 1200°C. for between about 5 seconds and about 60 seconds.

22. The method of claim 1, wherein the at least one rapid thermal annealing operation is carried out at about 1200° C. for about 30 seconds.

23. The method of claim 1, wherein the thinning step is carried out between two rapid thermal annealing operations.

24. The method of claim 23, wherein the thinning step includes a dry etching step.

25. The method of claim 23, wherein the thinning step includes annealing in an etching atmosphere including hydrochloric acid.

26. The method of claim 23, wherein the thinning step includes oxidation of the semiconductor structure at a temperature between about 800° C. and about 1000° C.

27. The method of claim 26, wherein the thinning step includes oxidation of the semiconductor structure at a temperature of about 950° C.

28. The method of claim 27, further comprising desoxidation of the semiconductor surface to remove the layer of oxide formed during the thinning step.

29. The method of claim 1, wherein a second rapid thermal annealing operation is carried out at a temperature of about 1250°C. for between about 5 seconds and about 60 seconds.

30. A product made according to the process of claim 1.

31. The product according to claim 30, wherein the product is an electronic device.

32. The product according to claim 30, wherein the product is an optical device.

33. The product according to claim 30, wherein the product is an optoelectronic device.

* * * * *